United States Patent [19]

Davis et al.

[11] Patent Number: 4,470,648
[45] Date of Patent: Sep. 11, 1984

[54] INTERCONNECTION CONSTRUCTION TO THICK FILM SUBSTRATE

[75] Inventors: Daniel A. Davis, Canton; Charles L. Henritzy, Grosse Pointe Farms, both of Mich.

[73] Assignee: Ford Motor Company, Dearborn, Mich.

[21] Appl. No.: 453,396

[22] Filed: Dec. 27, 1982

[51] Int. Cl.³ ............................................. A01R 3/06
[52] U.S. Cl. ............................. 339/14 R; 174/52 PE; 339/17 CF; 361/421
[58] Field of Search ................ 339/17 CF, 174, 14 R; 174/52 PE, 52 RP; 361/392–395, 405, 421

[56] References Cited

U.S. PATENT DOCUMENTS

| | | |
|---|---|---|
| 2,985,806 | 5/1961 | McMahon et al. ......... 174/52 FP X |
| 4,147,889 | 4/1979 | Andrews et al. ............... 174/52 FP |
| 4,158,745 | 6/1979 | Keller ............................. 174/52 FP |
| 4,234,666 | 11/1980 | Gursky ...................... 174/52 FP X |
| 4,335,463 | 10/1982 | Burns ......................... 174/52 FP X |

*Primary Examiner*—Eugene F. Desmond
*Attorney, Agent, or Firm*—Peter Abolins; Robert D. Sanborn

[57] ABSTRACT

An integral lead frame for a thick film substrate mounted in a housing has three portions. A first portion in the interior of the housing contacts the thick film substance with stress relieved terminals having an arcuate hoop and reduced width. A second portion includes vertical steps for changing the plane of the lead frame. The third portion includes a connector blade with a thickness greater than the terminal thickness.

10 Claims, 11 Drawing Figures

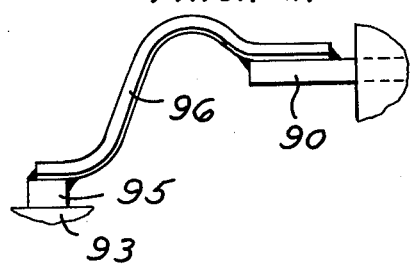
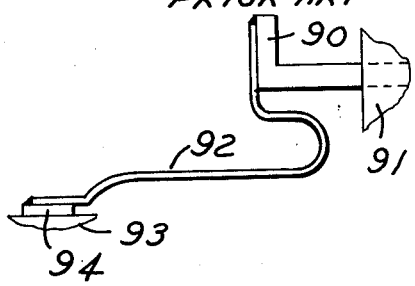
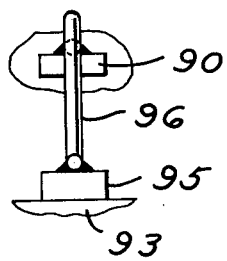
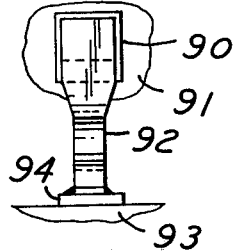
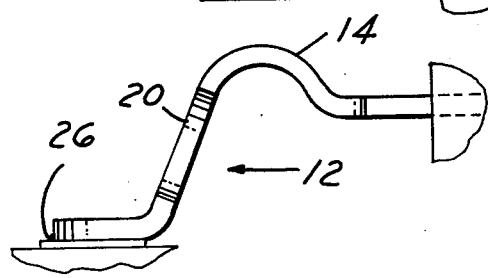
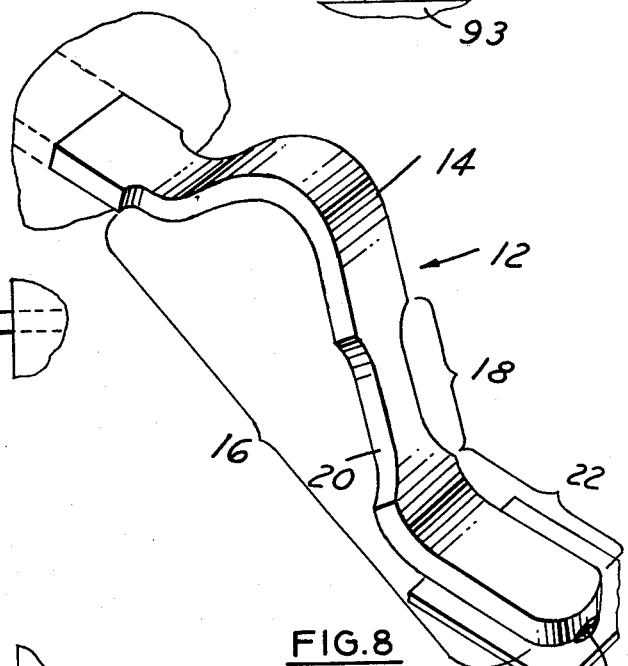
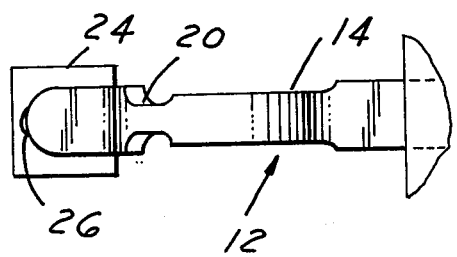
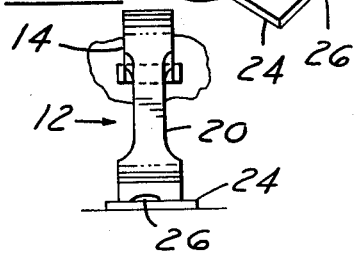

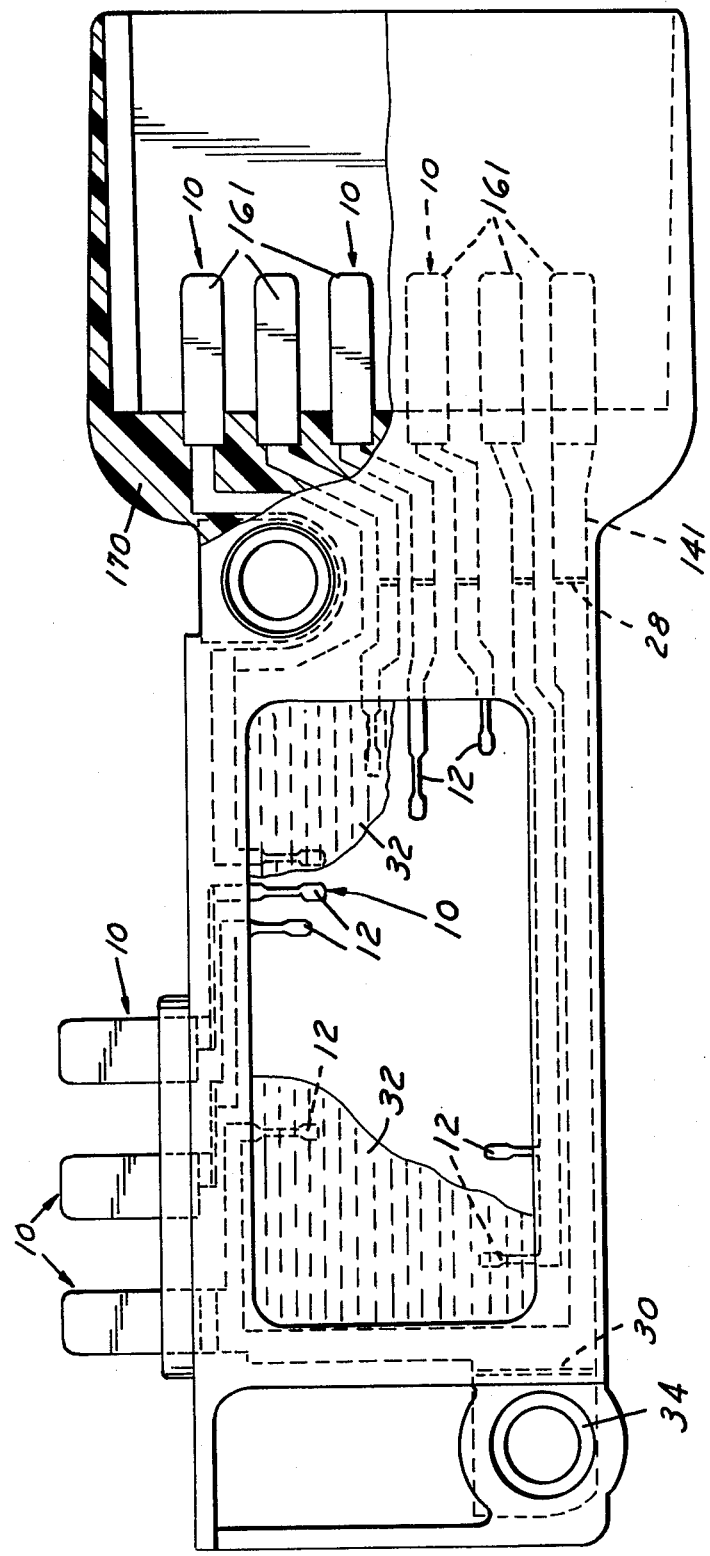

INTERCONNECTION CONSTRUCTION TO THICK FILM SUBSTRATE

FIELD OF THE INVENTION

This invention relates to interconnection structures and electrical circuits.

BACKGROUND OF THE INVENTION

Various techniques are known to interconnect a thick film substrate formed of materials such as alumina or beryllia to an electrical circuit. In particular, various techniques are known to connect a thick film substrate, mounted in a molded plastic housing, through the housing to additional electrical circuitry.

For example, referring to FIGS. 3 and 4, a terminal 90 extends through a housing 91. A ribbon or wire 92 with a solderable surface can be attached using solder 94 to a thick film substrate 93 and soldered or welded to terminal 90 at a portion extending beyond housing 91. The ribbon can be made of a nickel material.

Instead of having a direct connection to a pad on the thick film substrate an "anvil" 95 (FIGS. 1 and 2) can be attached to the pad of thick film substrate 93 and serve as the base for connection to a wire 96. Thus, a weld anvil 95 is soldered to substrate 93 and wire or strap 96 is welded to anvil 95 and welded to housing terminals 90. Wire made of copper is suitable for welding to the anvil and welding to the housing terminal.

Each of these known techniques has numerous manufacturing steps which add to cost and may affect reliability. It would be desirable to eliminate some of the manufacturing steps and eliminate some of the interconnect components required. These are some of the problems this invention overcomes.

FIG. 9 shows the prior art terminal connection of FIGS. 3 and 4 mounted in a housing. A gel 97 covers substrate 93 up to a height above terminal 90. In fact, the interior tip of terminal 90 is bent down from the position shown in FIG. 3 so that the depth of gel 97 can be reduced. It would be desirable to reduce further the depth of the gel.

Housing 91 is typically mounted so that a ground connection is contacted by bottom plate 80. To achieve a connection from plate 80 to a contact on substrate 93 an electrically conductive spacer 81 extends between plate 80 and a terminal 82. An electrically conductive ribbon 83 is coupled between terminal 82 and a connection pad on substrate 93. Spacer 81 is sufficiently rigid mechanically so that a mounting screw pressing terminal 82 toward plate 80 does not cause housing 91 adjacent to spacer 81 to cold flow or deform. Typically, spacer 81 is metal and housing 91 is plastic. It would be desirable to eliminate the need for this spacer.

SUMMARY OF THE DISCLOSURE

An integral structure is used to connect thick film substrates through a housing to an external electrical circuit thereby reducing cost and providing a more reliable structure to connect thick film substrates to an external electrical circuit.

An interconnection structure for a thick film substrate mounted in a housing having a housing wall includes a lead frame with three integral portions. The first portion is positioned on the interior side of the housing for contacting the thick film substrate. A second portion is integrally coupled to the first portion and is positioned within the housing wall. A third portion is integrally coupled to the second portion and extends beyond the housing wall for coupling to an external circuit. The lead frame is formed of one piece of material having a substantially uniform thickness which is folded to increase thickness at the third portion. The first portion includes a terminal with an arcuate hoop portion and a reduced width portion for providing stress relief. The second portion includes a stepped segment for providing connection between the plane of the first portion and the plane of the third portion. The third portion includes a connector blade with the thickness greater than the thickness of the terminal of the first portion.

The stepped segment permits a lower terminal portion and therefore a reduced height of a protective gel covering, in comparison to the height of the connector blade. The integral lead frame provides for simplicity of manufacture and yet has a configuration which provides stress relief.

BRIEF DESCRIPTION OF THE DRAWINGS

FIG. 1 is a side elevation view of a prior art interconnection using a wire coupled between a terminal and an anvil;

FIG. 2 is a front elevation view of the prior art embodiment of FIG. 1;

FIG. 3 is a prior art embodiment using a ribbon connected between a terminal and a thick film substrate;

FIG. 4 is a front elevation view of the prior art embodiment of FIG. 3;

FIG. 5 is a perspective view of a terminal of a lead frame in accordance with an embodiment of this invention;

FIG. 6 is a side elevation view of the terminal of FIG. 5;

FIG. 7 is a plan view of the terminal of FIG. 5;

FIG. 8 is a front elevation view of the terminal of FIG. 5;

FIG. 11 is a plan view of the lead frame mounted in a housing in accordance with an embodiment of this invention.

DETAILED DESCRIPTION OF THE INVENTION

Figure 10:
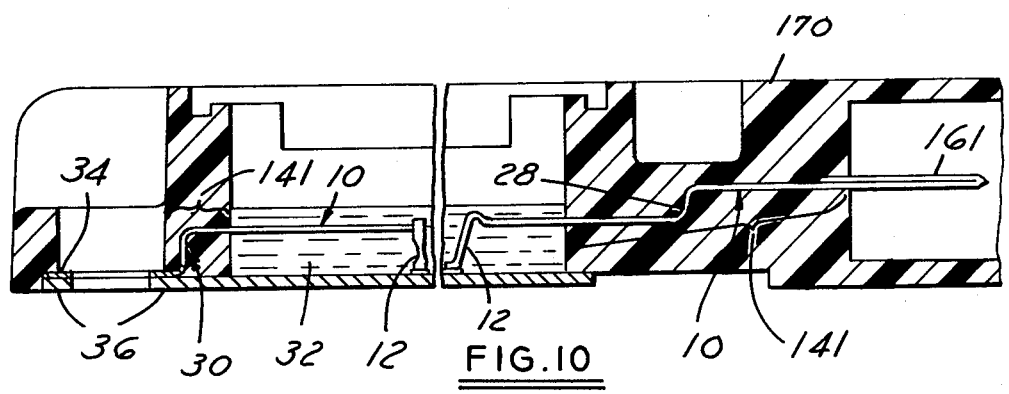
FIG. 10 is a side section view of the lead frame mounted in a housing in accordance with an embodiment of this invention and having a reduced potting gel height in comparison to FIG. 9.

Referring to FIG. 10, an interconnection construction includes a lead frame 10 with a terminal portion 12, a wall portion 141 and a connector portion 161. Referring to FIGS. 5, 6 and 7, terminal portion 12 includes an arcuate hoop 14, reduced width section 16, and notched portion 18 with opposing notches 20 further reducing the width of terminal portion 12. Terminal portion 12 further includes a foot portion 22 coupled to thick film substrate 24. The connection between foot 22 and substrate 24 is by a solder pad 26. To facilitate attachment, foot 22 can be wider than arcuate hoop 16 and notched portion 18.

Terminal portion 12 is designed to have an interference fit when assembled to substrate 24. This interference fit causes a deflection which insures a contact force for soldering. The undeflected position angle of foot portion 22 is formed to result in a parallel contact between foot portion 22 and solder pad 26 after deflection of foot portion 22 through assembly to substrate 24. The entire foot portion 22 is coated with a solderable plating for proper assembly to the solder pad 26. Durability of terminal portion 12 is further enhanced through material selection, typically brass.

Again referring to FIG. 10, connector portion 161 has a double thickness of metal compared to terminal portion 12 for forming connector blades. For example, 0.0125 inch metal can be folded to a 0.025 inch thickness. With respect to the upper plane of terminal 12, wall portion 141 includes an upward step 28 and a downward step 30. Because of the use of upward step 28, the potting level of a gel 32 can be maintained lower than the level of connector portion 161 thereby reducing the amount of gel required. The use of downward step 30 permits a ground connection 34 extending from wall portion 141 to be adjacent a mounting plate 36 for thick film substrate 24. Ground connection 34 is mechanically and electrically connected to mounting plate 36. Thus, no additional electrical connection component is required between the level of terminal portion 12 adjacent downward step 30 and mounting plate 36. Also, no additional mechanical support is required for ground connection 34.

Referring to FIG. 11, the interconnection structure to a thick film substrate 24 includes a plurality of lead frames 10 mounted in a housing 170. Each lead frame 10 has at least one terminal 12. Depending upon the external electrical circuit to be coupled to substrate 24, the number of terminal portions 12 and connector portions 161 associated with each lead frame 10 can be varied.

Wall portion 141 includes, in plan view, angled segments within housing 170 to connect a terminal 12 to an associated connector portion 161. Housing 170 can be secured to a supporting structure by a screw through an opening in ground connection 34.

Figure 9:
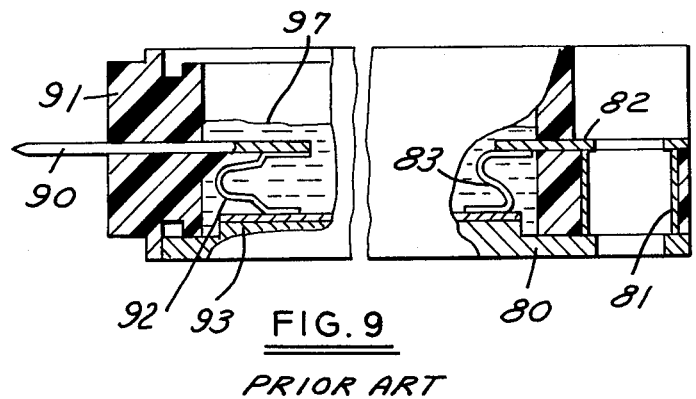
FIG. 9 is a side section view of a prior art connector and terminal similar to that shown in FIG. 3 mounted in a housing.

A typical extent of connector portion 161 beyond housing 170 is 7.5 mm. The vertical distance separating connector portion 161 from mounting plate 36 is about 6.19 to 6.35 mm. The vertical distance of upward step 28 is about 2.95 mm. Arcuate hoop 14 has a radius of about 0.50 mm. The notches of notched portion 18 each have a radius of about 1.84 mm. The vertical extent of terminal 12, excluding arcuate hoop 14 is about 3.0 mm. The width of terminal portion 12 adjacent wall portion 141 is about 1.02 mm. The width of reduced width section 16 is 0.76 mm. The depth of gel 32 is about 4.14 mm. This compares to a depth of about 9.53 mm for gel 97 in the prior art embodiment of FIG. 9.

Various modifications and variations will no doubt occur to those skilled in the arts to which this invention pertains. For example, the particular number of terminals and connectors may be varied from that disclosed herein. These and all other variations which basically rely on the teachings through which this disclosure has advanced the art are properly considered within the scope of this invention.

We claim:

1. An interconnection structure for a thick film substrate mounted in a housing having a housing wall and a base plate, said interconnection structure comprising:
   a lead frame having a first portion in the interior of said housing for contacting said thick film substrate, a second portion integrally coupled to said first portion and positioned within said housing wall, and a third portion integrally coupled to said second portion extending beyond said housing wall for coupling to an external circuit, said lead frame being formed of one piece of material having a substantially uniform original thickness;
   said first portion including a terminal with an arcuate hoop portion and a reduced width portion for providing stress relief;
   said second portion including stepped segments for providing connection between the plane of said first portion and the plane of said third portion; and
   said third portion including a connector blade with a thickness greater than the thickness of said terminal of said first portion.

2. An interconnection structure as recited in claim 1 wherein:
   said connector blade has a double thickness compared to said terminal and is formed by folding over the substantially uniform thickness material forming said lead frame.

3. An interconnection as recited in claim 2 wherein:
   said lead frame is made of a brass material.

4. An interconnection as recited in claim 3 wherein:
   said second portion includes an upward step from the level of an adjacent coupling to said first portion up to the level of an adjacent coupling to said third portion so that a protective gel material covering said first portion and said thick film substrate can have a level lower than the level of said third portion.

5. An interconnection as recited in claim 4 wherein:
   said second portion includes a downward step from the level of an adjacent coupling to said first portion down to the level of an adjacent coupling to a ground contact of said third portion so that electrical contact can be made to the base plate which supports said thick film substrate and there is no material between the base plate and said ground contact which may deform in response to a mounting force.

6. An interconnection structure as recited in claim 5 wherein:
   said first portion includes a terminal having a top arm extending in the plane of the adjacent portion of said second portion, a hoop extending up from said top arm in an arcuate trajectory, a leg extending down from said hoop to a foot for connection to said thick film substrate substantially all of said leg and said hoop having a width less than said adjacent portion of said second portion, and said leg including a pair of opposing notches further reducing the width of said leg.

7. An interconnection structure for a thick film substrate mounted in a housing having a housing wall and positioned on a mounting plate, said interconnection structure comprising:
   a plurality of lead frames each having a first portion within said housing for contacting said thick film substrate, a second portion integrally coupled to said first portion and positioned within said housing wall, and a third portion integrally coupled to said second portion extending beyond said housing wall for coupling to an external circuit;
   said lead frames each being formed of one piece of material having substantially uniform original thickness;
   said first portions having terminals having entry into said housing wall at substantially the same entry plane; and said second portions including a step for connecting an associated one of said first portions to a segment of an associated one of said third portions at an exit plane adjacent said housing wall, said exit plane being offset and spaced from said entry plane of said first portion.

8. An interconnection structure as recited in claim 7 wherein:

said step is an upward step for coupling said first portion to connectors in said third portion located in a plane higher than said entry plane.

9. An interconnection structure as recited in claim 7 wherein:

said step is a downward step for coupling said first portion to a ground connection in said third portion located in a plane lower than said entry plane and adjacent the mounting plane of said thick film substrate.

10. An interconnection structure as recited in claim 8 wherein:

said first portions each have terminals with an arcuate hoop portion, a reduced width portion and a pair of opposing notches in said reduced width portion further reducing the width of said leg so as to provide stress relief for said interconnection structure.

* * * * *